(12) United States Patent
Li et al.

(10) Patent No.: US 11,595,004 B2
(45) Date of Patent: Feb. 28, 2023

(54) HIGHLY LINEAR TIME AMPLIFIER WITH POWER SUPPLY REJECTION

(71) Applicant: NO.24 RESEARCH INSTITUTE OF CHINA ELECTRONICS TECHNOLOGY GROUP CORPORATION, Chongqing (CN)

(72) Inventors: Ting Li, Chongqing (CN); Zhengbo Huang, Chongqing (CN); Yong Zhang, Chongqing (CN); Yabo Ni, Chongqing (CN); Jian'an Wang, Chongqing (CN); Dongbing Fu, Chongqing (CN)

(73) Assignee: NO. 24 RESEARCH INSTITUTE OF CHINA ELECTRONICS TECHNOLOGY GROUP CORPORATION, Chongqing (CN)

( * ) Notice: Subject to any disclaimer, the term of this patent is extended or adjusted under 35 U.S.C. 154(b) by 81 days.

(21) Appl. No.: 17/057,698

(22) PCT Filed: May 13, 2019

(86) PCT No.: PCT/CN2019/086599
§ 371 (c)(1),
(2) Date: Nov. 23, 2020

(87) PCT Pub. No.: WO2019/223561
PCT Pub. Date: Nov. 28, 2019

(65) Prior Publication Data
US 2021/0203277 A1    Jul. 1, 2021

(30) Foreign Application Priority Data

May 23, 2018  (CN) .......................... 201810500011.4

(51) Int. Cl.
*H03F 1/02* (2006.01)
*H03F 3/45* (2006.01)
(Continued)

(52) U.S. Cl.
CPC ............. *H03F 1/0211* (2013.01); *H03F 3/45* (2013.01); *H03K 17/22* (2013.01); *H03K 17/28* (2013.01)

(58) Field of Classification Search
CPC ........ H03F 1/02; H03F 1/0205; H03F 1/0211; H03F 1/0216; H03F 1/0222; H03F 1/32;
(Continued)

(56) References Cited

U.S. PATENT DOCUMENTS 8,031,888 B2 * 10/2011 Kato ....................... H03F 1/305
330/257
9,407,217 B2 * 8/2016 Kagano ..................... H03F 3/45
2003/0223601 A1   12/2003 Kato et al.

* cited by examiner

*Primary Examiner* — Long Nguyen

(57) ABSTRACT

A highly linear time amplifier with power supply rejection. In a reset stage, the threshold value of an over-threshold detector is used for resetting an output node of an amplifier, to eliminate the impact of power supply voltage changes on the threshold value of the threshold detector. A node capacitor unit is charged under the control of an input clock signal. After completion of charging, the node capacitor unit is discharged under the control of a synchronous clock signal. The time amplification gain only depends on the proportion of the charge and discharge current, and the charging and discharging time are completely linear in principle, which eliminates the nonlinearity of the traditional time amplifier, and reduces the negative impact of threshold change on system performance.

10 Claims, 5 Drawing Sheets

(51) Int. Cl.
*H03K 17/22* (2006.01)
*H03K 17/28* (2006.01)

(58) Field of Classification Search
CPC ....... H03F 1/305; H03F 1/3211; H03K 17/22; H03K 17/223; H03K 17/28; H03K 17/284

See application file for complete search history.

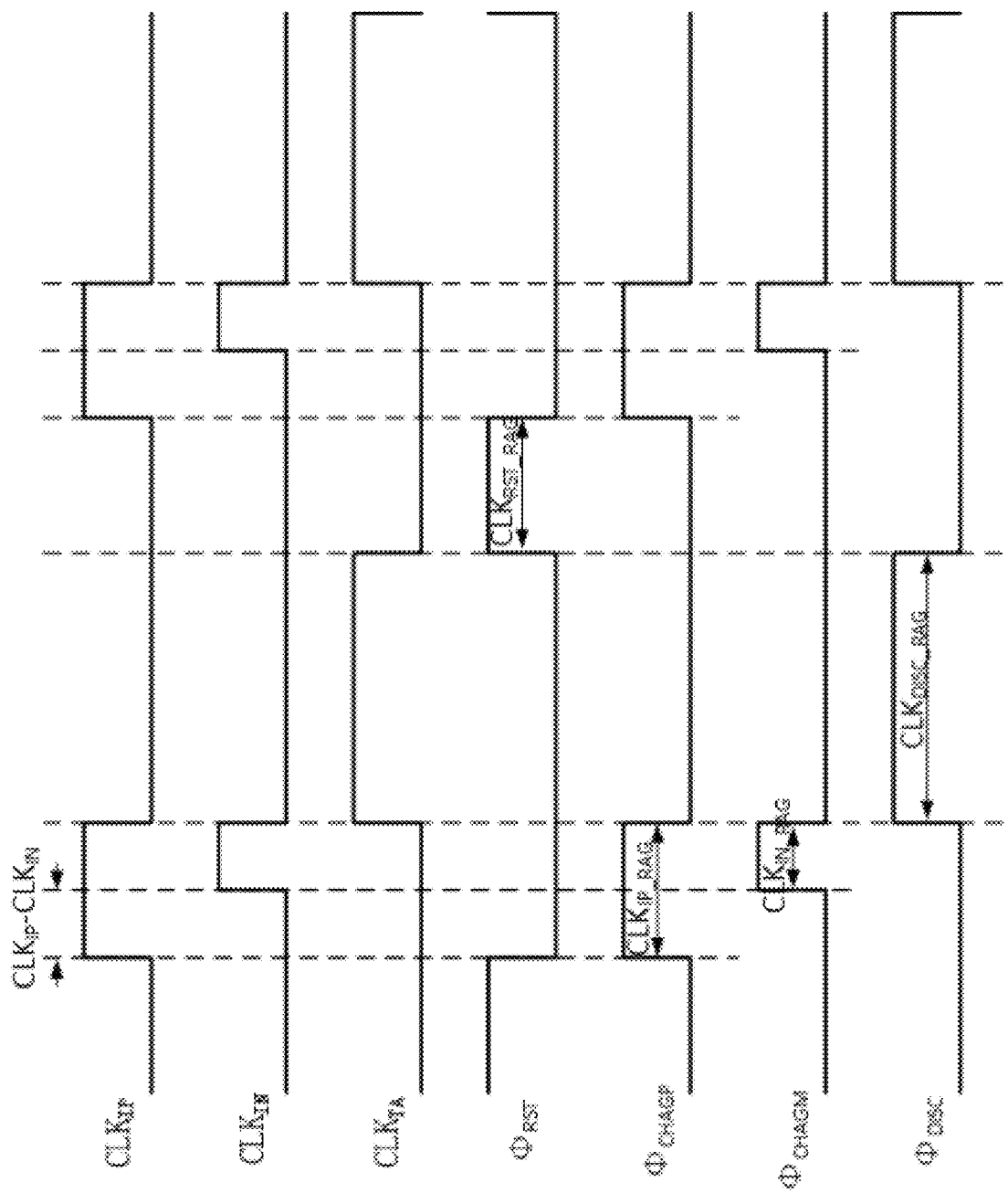

HIGHLY LINEAR TIME AMPLIFIER WITH POWER SUPPLY REJECTION

CROSS REFERENCES TO RELATED APPLICATIONS

This is a Sect. 371 National Stage of a PCT International Application No. PCT/CN2019/086599, filed on May 13, 2019, which claims priority to a Chinese Patent Application No. CNA201810500011.4, filed with CNIPO on May 23, 2018, the contents of which are incorporated herein by reference in its entirety.

TECHNICAL FIELD

The disclosure relates to the field of electronics, in particular to a highly linear time amplifier with power supply rejection.

BACKGROUND

Time Amplifier (TA), is a device amplifying the time difference between electronic signals. TA can amplify the time delay, and is often used in the time amplification after Voltage-to-time converter (VTC), or is used in the increase of the input signal range before Time to Digital Converter (TDC).

At present, the traditional time amplifier usually charges or discharges the capacitor by using a resistor. By designing the ratio of resistance, the magnification of TA is designed. On the one hand, the structure controls the discharge time of the node capacitor by using the input signal, the discharge time will limit the input signal hold time, especially in applications with large amplification factors, which severely limits the working efficiency of the input signal generating circuit. On the other hand, the time amplifier of the structure discharges by using a resistor, the non-linearity is very serious, which seriously limits the application of TA in highly linear environments. In addition, the threshold voltage of over-threshold detector of the traditional time amplifier's varies greatly with fluctuations of power supply voltage, which seriously affects the performance of the amplifier. Therefore, it is urgent for a time amplifier that can eliminate the influence of power supply voltage changes on the amplification performance of the amplifier and improve system integrity.

SUMMARY

The present disclosure provides a highly linear time amplifier with power supply rejection.

A highly linear time amplifier with power supply rejection provided by the present disclosure includes: a clock control logic generating unit, receiving the input clock signal and a synchronous clock signal, and generating a control clock signal; a node capacitor unit, charging and discharging according to the control clock signal; a switching power supply unit, comprising a plurality of switching constant current source modules, an input terminal of the switching constant current source module is connected with an output terminal of the clock control logic generating unit; the switching constant current source module charges the node capacitor unit under a control of the input clock signal, after charging is completed, the node capacitor unit discharge under a control of the synchronous clock signal, to achieve time amplification.

The highly linear time amplifier with power supply rejection further includes: an over-threshold detection unit, performing over-threshold detection; a resetting network, comprising an over-threshold detector common mode generating unit and a common mode output buffer interconnected with the over-threshold detection unit; an input terminal of the over-threshold detection unit is connected with an output terminal of the over-threshold detector common mode generating unit, for resetting according to the common mode level generated by the over-threshold detector common mode generating unit; the input clock signal comprises a first input clock signal and a second input clock signal, the clock logic generating unit generates a control clock signal for controlling the charging time of the switch constant current source module according to the difference in clock delay between the first input clock signal and the second input clock signal.

Furthermore, the over-threshold detection unit comprises a first over-threshold detector and a second over-threshold detector, the switching power supply unit comprises a first switching constant current source module, a second switching constant current source module, a third switching constant current source module, and a fourth switching constant current source module, the control clock signal comprises a first control clock signal, a second control clock signal, a third control clock signal and a fourth control clock signal; an input terminal of the first switching constant current source module is connected with the first control clock signal, and an input terminal of the third switching constant current source module is connected with the fourth control clock signal, an input terminal of the second switching constant current source module and an input terminal of the fourth switching constant current source module are respectively connected with the third control clock signal, and the second control clock signal is respectively connected with an input terminal of the first over-threshold detector and an input terminal of the second over-threshold detector, an output terminal of the first over-threshold detector is a first output interface, and an output terminal of the second over-threshold detector is a second output interface.

Furthermore, the reset network further comprises a first reset switch and a second reset switch, the second control clock signal is connected with the input terminal of the first over-threshold detector through the first reset switch, and the second control clock signal is further connected with the input terminal of the second over-threshold detector through the second reset switch.

Furthermore, the node capacitor unit comprises a first node capacitor and a second node capacitor, an output terminal of the first switch constant current source module, an output terminal of the second switching constant current source module, an upper plate of the first node capacitor and one terminal of the first reset switch are connected with the first over-threshold detector, an input terminal of the first switch constant current source module and a lower plate of the first node capacitor are grounded, the other terminal of the first reset switch is connected with an output terminal of the common mode output buffer, an input terminal of the common mode output buffer is connected with an output terminal of the over-threshold detector common mode generating unit, an input terminal of the over-threshold detector common mode generating unit is short-circuited with an output terminal the over-threshold detector common mode generating unit, to generate an over-threshold detector common mode level; an output terminal of the third switching constant current source module, an output terminal of the fourth switching constant current source module, an upper electrode plate of the second node capacitor and one terminal of the second reset switch are connected with the second over-threshold detector, a lower electrode plate of the second node capacitor is grounded, the other terminal of the reset switch is connected with the output terminal of the common mode output buffer.

Furthermore, a charging time of the first switching constant current source module is controlled according to the first control clock signal, and a charging time of the fourth switching constant current source module is controlled according to the fourth control clock signal, after the charging is completed, the second switching constant current source module and the fourth switching constant current source module discharge to the first node capacitor and the second node capacitor, under a control of the third control clock signal, until the input levels of the first over-threshold detector and the second over-threshold detector reach threshold values respectively, then the outputs of the first over-threshold detector and the second over-threshold detector are reversed to complete the time amplification.

Furthermore, output channels of the first output interface and the second output interface have a pseudo-differential structure.

Furthermore, the circuit structure of the first over-threshold detector is same as the circuit structure of the second over-threshold detector, the over-threshold detection units comprise one or more inverters, the first inverter at the input terminal of the first over-threshold detector and the second over-threshold detector has a structure the same as a structure of the over-threshold detector common mode generating unit.

Furthermore, the amplification factor of the time amplifier is obtained by the following formula:

$$\begin{cases} t_{discp} = \dfrac{I_{CHAGP}}{I_{DISCP}} t_{chagp} - \dfrac{V_M}{I_{DISCP}} C_{SP} \\ t_{discn} = \dfrac{I_{CHAGN}}{I_{DISCN}} t_{chagn} - \dfrac{V_M}{I_{DISCN}} C_{SN} \end{cases}$$

$V_M$ is the reset level, $t_{chagp}$ and $t_{chagn}$ are the charging time determined by the first clock control signal and the second clock control signal respectively, $t_{discp}$ and $t_{discn}$ are the time that the input level of the first over-threshold detector and the second the over-threshold detector decreases to the corresponding threshold value respectively, $I_{CHAGP}$ is the first constant current source, $I_{CHAGN}$ is the second constant current source, $I_{DISCP}$ is the third constant current source, and $I_{DISCN}$ is the fourth constant current source.

Furthermore, the switch constant current source module outputs a constant current during operation.

The beneficial effect of the present disclosure: the time amplification gain of the highly linear time amplifier with power supply rejection in the present disclosure only depends on the proportion of the charge and discharge current, and the charging and discharging time are completely linear in principle, which eliminates the nonlinearity of the traditional time amplifier, and reduces the negative impact of threshold change on system performance. The charging process in the present disclosure is controlled by an input clock, the input signal sampling is completed during the charging process, and the discharging process is controlled by a synchronous clock. The input signal is isolated from the discharging process, and the limitation of the discharging process on the working rate of the input signal generating circuit is eliminated, by multiple time interleaving, the overall performance of the system is improved. The disclosure also provides a technology to reduce the influence of the power supply voltage disturbance and reduce the influence of the power supply voltage fluctuation on the threshold value of the over-threshold detection unit, thereby improving system performance.

BRIEF DESCRIPTION OF THE DRAWINGS

FIG. 6 is a schematic diagram of the output time sequence relationship of the clock logic unit of the highly linear time amplifier with power supply rejection in an embodiment of the present disclosure.

DETAILED DESCRIPTION OF THE PREFERRED EMBODIMENTS

The embodiments of the present disclosure will be described below through exemplary embodiments. Those skilled in the art can easily understand other advantages and effects of the present disclosure according to contents disclosed by the specification. The present disclosure can also be implemented or applied through other different exemplary embodiments. Various modifications or changes can also be made to all details in the specification based on different points of view and applications without departing from the spirit of the present disclosure.

It needs to be stated that the drawings provided in the following embodiments are just used for schematically describing the basic concept of the present disclosure, thus only illustrating components only related to the present disclosure and are not drawn according to the numbers, shapes and sizes of components during actual implementation, the configuration, number and scale of each component during actual implementation thereof may be freely changed, and the component layout configuration thereof may be more complicated.

Figure 1:
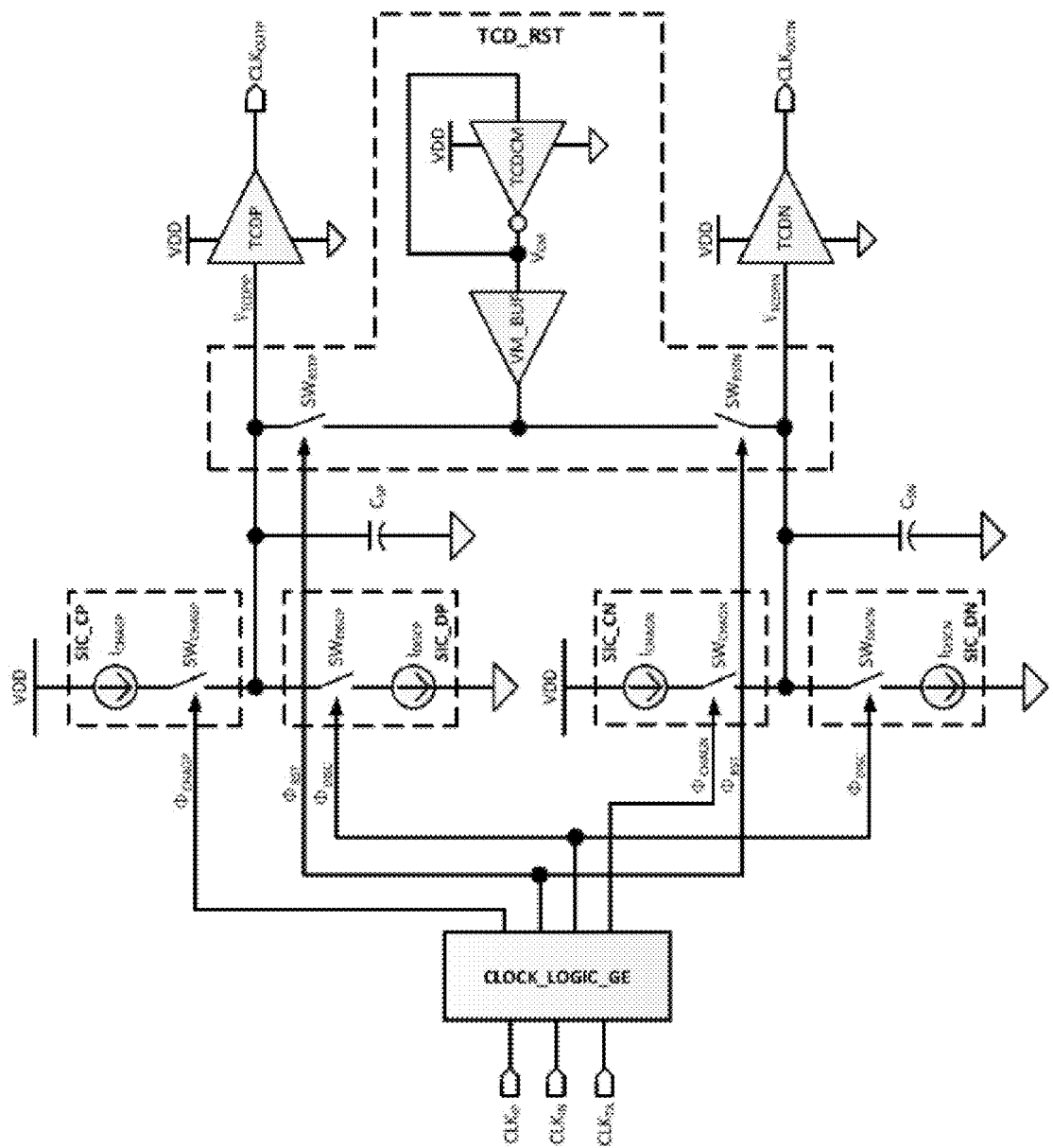
FIG. 1 is a schematic diagram of a highly linear time amplifier with power supply rejection in an embodiment of the present disclosure.

As shown in FIG. 1, the highly linear time amplifier with power supply rejection in the present embodiment mainly includes: a clock control logic generating unit, a node capacitor unit, a switching power supply unit, an over-threshold detection unit, a reset network.

The clock control logic generating unit CLOCK_LOGIC_GE may receive the input clock signals $CLK_{IP}$, $CLK_{IN}$ and the synchronous clock signal $CLK_{TA}$, and generating control clock signals $\phi_{CHAGP}$, $\phi_{RST}$, $\phi_{DISC}$ and $\phi_{CHAGN}$.

The node capacitor unit may charge and discharge according to a control clock signal.

The switching power supply unit includes a plurality of switching constant current source modules, the input terminal of the switching constant current source module is connected with an output terminal of the clock control logic generating unit.

The switching constant current source modules SIC_CP and SIC_CN charge the node capacitors $C_{SP}$ and $C_{SN}$ units under the control of the input clock signals $\phi_{CHAGP}$ and $\phi_{CHAGN}$; after charging is completed, the switching constant current source modules SIC_DP and SIC_DN discharges to the node capacitor $C_{SP}$ and $C_{SN}$ units under the control of the synchronous clock signal $\phi_{DISC}$, thereby achieving the time amplification process.

The over-threshold detection unit TCDP and TCDN may perform threshold detection.

The reset network TCD_RST includes a threshold detector common mode generating unit TCDCM and a common mode output buffer VM_BUF interconnected with the threshold detecting unit. The threshold-detecting unit includes a first over-threshold detecting device TCDP and a second over-threshold detecting device TCDN.

The input terminals of the first over-threshold detector TCDP and the second over-threshold detector TCDN are respectively connected with the output terminals of the common mode output buffer VM_BUF. The input terminal of the common mode output buffer VM_BUF is connected with the output terminal of the over-threshold detector common mode generating unit TCDCM, which is reset according to the common mode level generated by the over-threshold detector common mode generating unit.

The input clock signal includes a first input clock signal $CLK_{IP}$ and a second input clock signal $CLK_{IN}$, the clock logic generating unit CLOCK_LOGIC_GE generates control clock signals $\phi_{CHAGP}$ and $\phi_{CHAGN}$ for controlling the charging time of the switching constant current source module according to the clock delay difference between the first input clock signal $CLK_{IP}$ and the second input clock signal $CLK_{IN}$.

In the present embodiment, the conversion capacitor is charged or discharged by clock control logic CLOCK_LOGIC_GE and a set of ultra-high-speed constant current sources SIC_CP, SIC_CN, SIC_DP and SIC_DN respectively. TA magnification times depend on the ratio of charge current to the discharge current. The relationship between the charge time $t_{charge}$ and the discharge time $t_{discharge}$ meet the following equation:

$$t_{discharge} = \frac{I_{chg}}{I_{dis}} t_{charge} - \frac{V_M}{I_{dis}} C$$

$I_{chg}$ is the charging current, $I_{dis}$ is the discharging current, $V_M$ is the threshold voltage of the over-threshold check circuit, $V_0$ is the target voltage of the charging network, C is the charge and discharge node capacitor. The time amplification gain only depends on the ratio of the charge current to the discharge current. The charge time and the discharge time are completely linear in principle, which can eliminate the non-linear of the traditional TA.

As the traditional TA often performs over-threshold detection by using inverters or other simple structures, the detection threshold voltage of the over-threshold detector varies greatly with the power supply voltage, which affects system performance. However, in the present embodiment, the time amplifier can reduce the negative impact of the threshold change on system performance and improve system performance by using a reset common mode generation technology for the over-threshold detector. In present embodiment, the charging process is controlled by the input clock, the input signal is sampled during the charging process, the discharge process is controlled by the synchronous clock, the input signal is isolated from the discharge process, so as to eliminate the limitation to the operating rate of the input signal generating circuit by the discharge. The performance of the system is improved by multi-time interleaving technology.

An exemplary embodiment is described in the following.

As shown in FIG. 1, the switching power supply module of the time amplifier in present embodiment includes: a first switching constant current source module SIC_CP including a constant current source $I_{CHAGP}$ and a switch SW CHAGP; a second switching constant current source module SIC_DP including a constant current source $I_{DISCP}$ and a switch $SW_{DISCP}$; a third switching constant current source module SIC_CN including a constant current source $I_{CHAGM}$ and switch $SW_{CHAGN}$; a fourth switching constant current source module SIC_DN including a constant current source $I_{DISCN}$ and a switch $SW_{DISCN}$; a node capacitor unit including a first node capacitor $C_{SP}$ and a second node capacitor $C_{SN}$; a reset network TCD_RST including a first reset switch $SW_{RSTP}$, a second reset switch $SW_{RSTN}$, an over-threshold detector common mode generating unit TCDCM and common mode output buffer VM_BUF. The over-threshold detection unit includes a first over-threshold detector TCDP and a second threshold detector TCDN. The control clock signal includes a first control clock signal $\phi_{CHAGP}$, a second control clock signal $\phi_{RST}$, a third control clock signal $\phi_{DISC}$, and a fourth control clock signal $\phi_{CHAGN}$.

In the present embodiment, the first switching constant current source SIC_CP is connected with the output node of the second switching constant current source SIC_DP, and is connected with the upper plate of the node capacitor $C_{SP}$, the output terminal of switches $SW_{RSTP}$ and input terminal of the over-threshold detector TCDP. The input terminal of the first switching constant current source module SIC_CP is respectively connected with power supply VDD and clock $\phi_{CHAGP}$. The input terminals of the second switching constant current source module SIC_DP is respectively connected with the ground level and the clock $\phi_{DISC}$. The lower plate of the first node capacitor $C_{SP}$ is connected with the ground level. The other terminal of switch $SW_{RSTP}$ is connected with the output terminal of the common mode output buffer VM_BUF. The input terminal of the common mode buffer VM_BUF is connected with the output terminal of the over-threshold detector common mode generating unit TCDCM. The input terminal of over-threshold detector common mode generating unit TCDCM is shorted to its own output terminal to generate the common mode level of the over-threshold detector. The switch $SW_{RSTP}$ controls clock connection timing $\phi_{RST}$, an output terminal of over-threshold detector is connected with the output interface $CLK_{OUTP}$.

The third switching constant current source SIC_CN is connected with the output node of the fourth SIC_DN, and is connected with the upper plate of the second node capacitor $C_{SN}$, the output terminal of switch $SW_{RSTN}$ and the input terminal of the over-threshold detector TCDN. The input terminals of the third switching constant current source SIC_CN are respectively connected with the power supply VDD and the clock $\phi_{CHAGN}$. The input terminal of the fourth switching constant current source SIC_DN is connected with ground level and clock $\phi_{DISC}$. Lower plate of node capacitor $C_{SN}$ is connected with ground level. The other terminal of switch $SW_{RSTN}$ is also connected with the output terminal of common mode output buffer VM_BUF. Switch $SW_{RSTN}$ controls clock connection timing sequence $\phi_{RST}$, the output terminal of the over-threshold detector is connected with the output interface $CLK_{OUTN}$.

The clock control logic generating unit CLOCK_LOGIC_GE receives the input clocks $CLK_{IP}$, $CLK_{IN}$ and the synchronous clock $CLK_{T4}$, and generates a first control clock signal $\phi_{CHAGP}$, a third control clock signal $\phi_{DISC}$, a second control clock signal $\phi_{RST}$ and a fourth control clock signal $\phi_{CHAGN}$ for controlling the constant current sources, which controls the first switching constant current source SIC_CP, the second switching constant current source SIC_DP, the fourth switching constant current source SIC_DN, the first reset switch $SW_{RSTP}$, the second reset switch SW RSTN, and the third switching constant current source SIC_CN, respectively.

The working timing sequence generated by the clock logic generating unit CLOCK_LOGIC_GE in present embodiment is shown in FIG. 6. First, the clock $\phi_{RST}$ is high level, and the input levels of the first over-threshold detector TCDP and the second over-threshold detector TCDN are reset by the common mode level generated by the over-threshold detector common mode generating unit TCDCM. Then the clock logic generating unit CLK_LOGIC_GE generates clocks $\phi_{CHAGP}$ and $\phi_{CHAGN}$ according to the different clock delays of the input clocks $CLK_{IP}$ and $CLK_{IN}$ to determine the charging time of the switching constant current source SIC_CP and charging time of the switching constant current source SIC_CN, respectively. After the charging is completed, the constant current sources SIC_DP and SIC_DN discharge to the first node capacitor $C_{SP}$ and the second node capacitor $C_{SN}$ at the same time, under the control of the clock $\phi_{DISC}$, until the input levels of both the first over-threshold detector TCDP and the second over-threshold detector TCDN reach their threshold values respectively, then the outputs of TCDP and TCDN are reversed to complete the time amplification process.

Figure 3:
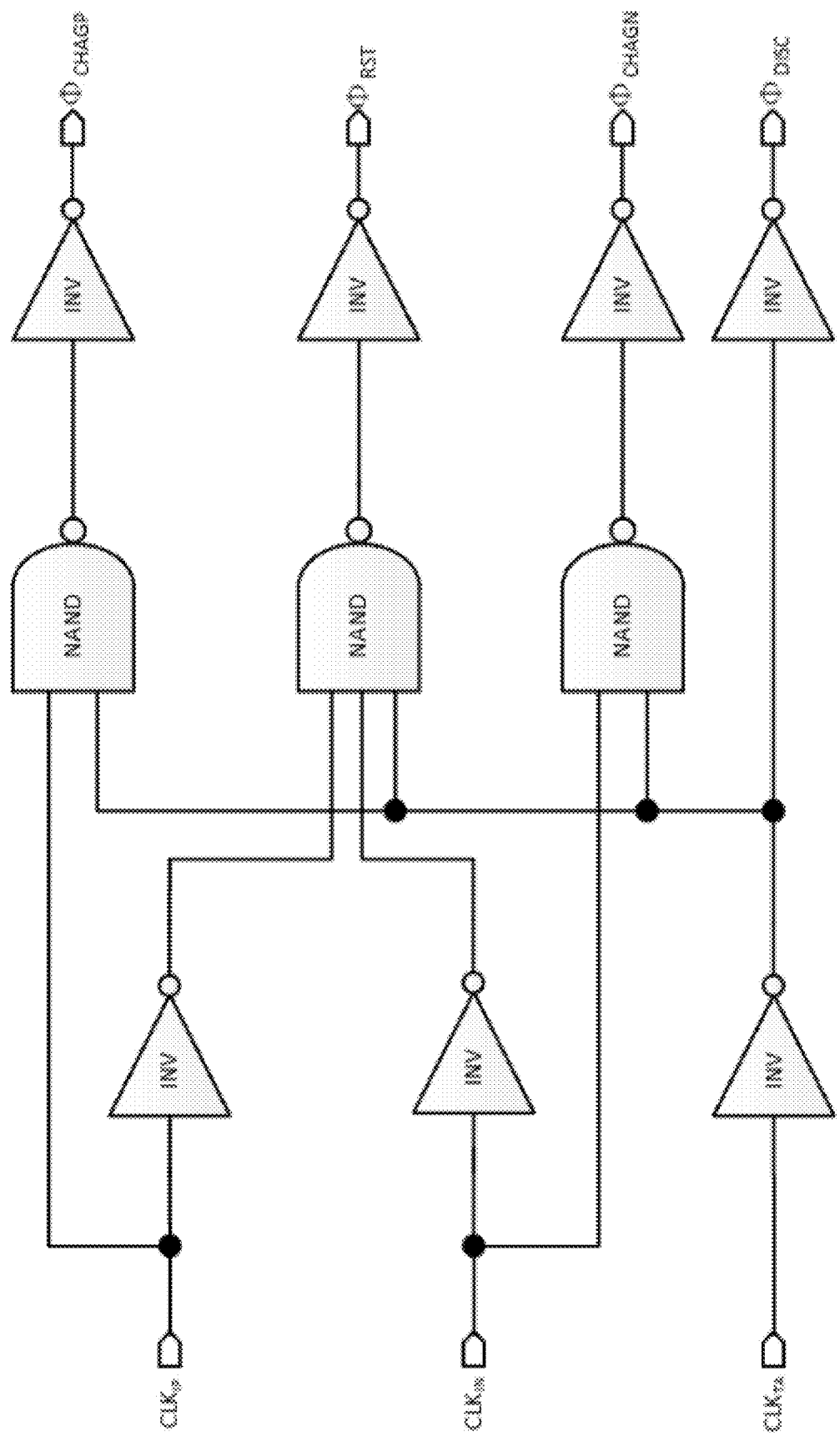
FIG. 3 is a schematic diagram of the logic generating unit of the highly linear time amplifier with power supply rejection in an embodiment of the present disclosure.

As shown in FIG. 3, the inverted synchronization clock signal $CLK_{T4}$ in present embodiment is performed logic "AND" operation with the first input clock signal $CLK_{IP}$ and the second input clock signal $CLK_{IP}$, respectively, so as to generate the charging timing sequence $\phi_{CHAGP}$ and $\phi_{CHAGN}$ of the switching constant current source SIC_CP and SIC_CN. The first input clock signal $CLK_{IP}$, the second input clock signal $CLK_{IN}$ and the synchronous clock signal $CLK_{T4}$ are "inverted" and then perform a logical "AND" operation to obtain a reset timing $\phi_{RST}$. The synchronous clock signal $CLK_{T4}$ generates a discharge timing sequence $\phi_{DISC}$ after passing a buffer delay.

Figure 2:
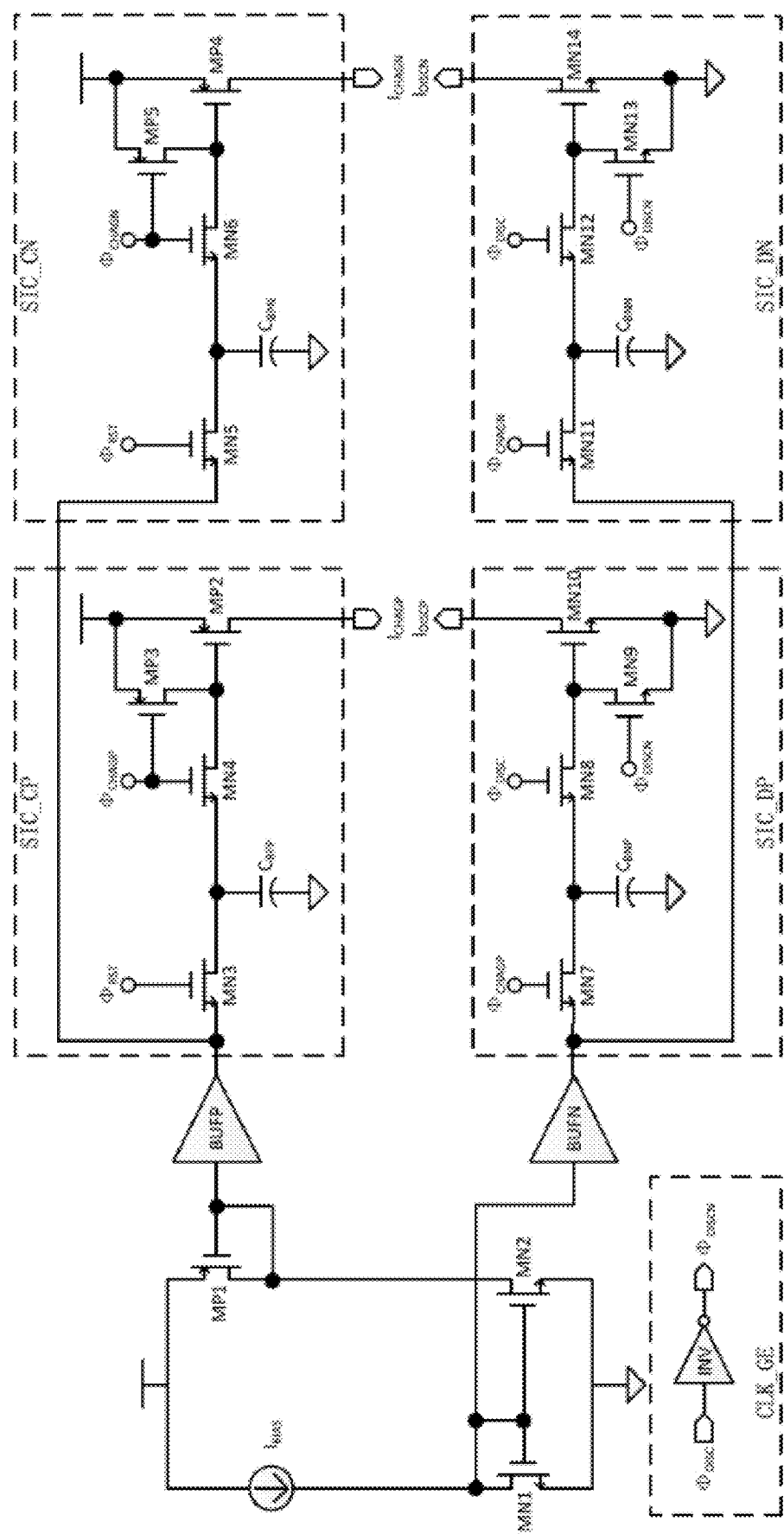
FIG. 2 is a schematic diagram of a switching constant current source module of a highly linear time amplifier with power supply rejection in an embodiment of the present disclosure.

As shown in FIG. 2, the switching constant current source modules SIC_CP, SIC_CN, SIC_DP and SIC_DN in present embodiment use the reference current IBIAS, MOSFET MN1, MN2 and MP1 to form the basic current mirror, and bias voltage is provided for the switching constant current source SIC_CP, SIC_CN, SIC_DP and SIC_DN through the buffers BUFP and BUFN. When the reset timing sequence $\phi_{RST}$ is high level, the reference sampling capacitors $C_{BPP}$, $C_{BPN}$, $C_{BNP}$, and $C_{BNN}$ respectively samples and maintains corresponding reference voltage values. When the charging timing sequence $\phi_{CHAGP}$ and $\phi_{CHAGN}$ are high level, they provide a bias voltage for current sources MOSFET MP2 and MP4 respectively, thereby providing the charging currents $I_{CHAGP}$ and $I_{CHAGN}$ with reference to the reference current $I_{BIAS}$ to complete the charging sampling process of the input signal. When the discharge timing sequence $\phi_{DISC}$ is high level, they provide bias voltage for the current source MOSFET MN10 and MN14 respectively, thereby providing the discharge currents $I_{DISCP}$ and $I_{DISCN}$ with reference to the reference current IBIAS to complete the time amplification process.

Figure 4:
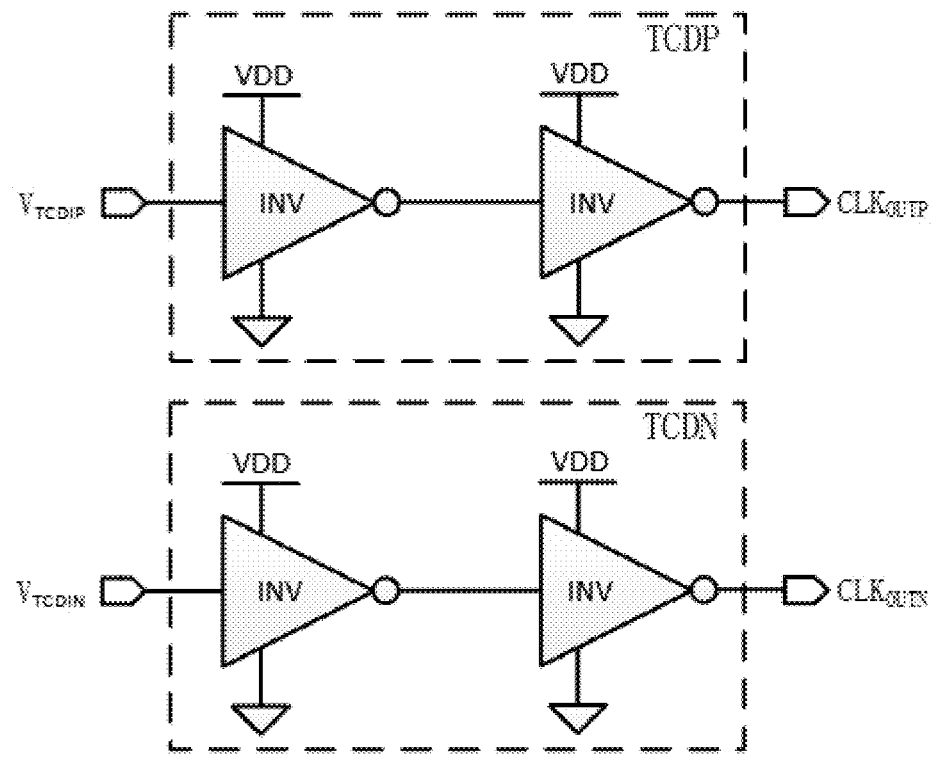
FIG. 4 is a schematic diagram of an over-threshold detector of a highly linear time amplifier with power supply rejection in an embodiment of the present disclosure.
Figure 5:
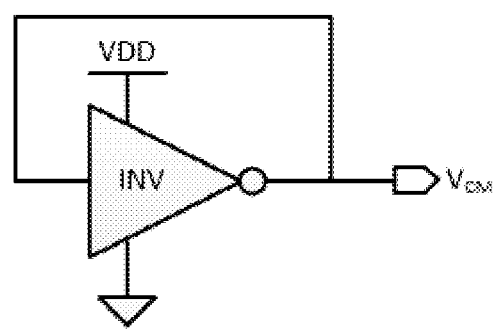
FIG. 5 is a schematic diagram of the common mode generating unit of the over-threshold detector of a highly linear time amplifier with power supply rejection in an embodiment of the present disclosure.

As shown in FIG. 4, the first over-threshold detector TCDP and the second over-threshold detector TCDN in present embodiment are respectively composed of two inverters. In present embodiment, the number of inverters can be increased or decreased according to the timing sequence. As shown in the FIGS. 4 and 5, the common mode generating unit of the over-threshold detector TCDCM has a structure the same as the first inverter at the input terminal of the first over-threshold detector TCDP and the second over-threshold detector TCDN, and has a strict proportional size, so that the threshold generated by the over-threshold detector common mode generating unit TCDCM shown in FIG. 5 is exactly the same as the threshold generated by the over-threshold detector TCDP and TCDN as shown in the FIG. 3, and have the same affection caused by the power supply voltage.

The above-mentioned embodiments merely illustrate the principle of the present disclosure and its effects, but are not intended to limit the present disclosure. Anyone familiar with this technology can modify or change the above embodiments without departing from the spirit and scope of the present disclosure. Therefore, all equivalent modifications or changes made by those with ordinary knowledge in the technical field without departing from the spirit and technical ideas disclosed by the present disclosure should still be covered by the claims of the present disclosure.

The invention claimed is:

1. A highly linear time amplifier with power supply rejection, comprising
   a clock control logic generating unit, receiving an input clock signal and a synchronous clock signal, and generating a control clock signal;
   a node capacitor unit, charging and discharging according to the control clock signal;
   a switching power supply unit, comprising a plurality of switching constant current source modules, an input terminal of each of the plurality of switching constant current source modules is connected with an output terminal of the clock control logic generating unit;
   wherein the plurality of switching constant current source modules charges the node capacitor unit under a control of the input clock signal, and after charging is completed, the node capacitor unit discharge under a control of the synchronous clock signal, to achieve time amplification.

2. The highly linear time amplifier with power supply rejection according to claim 1, further comprising:
   an over-threshold detection unit, performing over-threshold detection;
   a resetting network, comprising an over-threshold detector common mode generating unit and a common mode output buffer interconnected with the over-threshold detection unit;
   wherein an input terminal of the over-threshold detection unit is connected with an output terminal of the over-threshold detector common mode generating unit, for resetting according to the common mode level generated by the over-threshold detector common mode generating unit;
   the input clock signal comprises a first input clock signal and a second input clock signal, the clock control logic generating unit generates the control clock signal for controlling the charging time of the plurality of switch constant current source modules according to the difference in clock delay between the first input clock signal and the second input clock signal.

3. The highly linear time amplifier with power supply rejection according to claim 2, wherein
the over-threshold detection unit comprises a first over-threshold detector and a second over-threshold detector,
the plurality of switching constant current source modules comprises a first switching constant current source module, a second switching constant current source module, a third switching constant current source module, and a fourth switching constant current source module,
the control clock signal comprises a first control clock signal, a second control clock signal, a third control clock signal and a fourth control clock signal;
an input terminal of the first switching constant current source module is connected with the first control clock signal, and an input terminal of the third switching constant current source module is connected with the fourth control clock signal, an input terminal of the second switching constant current source module and an input terminal of the fourth switching constant current source module are respectively connected with the third control clock signal, and the second control clock signal is respectively connected with an input terminal of the first over-threshold detector and an input terminal of the second over-threshold detector, an output terminal of the first over-threshold detector is a first output interface, and an output terminal of the second over-threshold detector is a second output interface.

4. The highly linear time amplifier with power supply rejection according to claim 3, wherein
the resetting network further comprises a first reset switch and a second reset switch,
the second control clock signal is connected with the input terminal of the first over-threshold detector through the first reset switch, and
the second control clock signal is further connected with the input terminal of the second over-threshold detector through the second reset switch.

5. The highly linear time amplifier with power supply rejection according to claim 4, wherein
the node capacitor unit comprises a first node capacitor and a second node capacitor,
an output terminal of the first switch constant current source module, an output terminal of the second switching constant current source module, an upper plate of the first node capacitor and one terminal of the first reset switch are connected with the first over-threshold detector,
an input terminal of the first switch constant current source module and a lower plate of the first node capacitor are grounded,
the other terminal of the first reset switch is connected with an output terminal of the common mode output buffer,
an input terminal of the common mode output buffer is connected with an output terminal of the over-threshold detector common mode generating unit,
an input terminal of the over-threshold detector common mode generating unit is short-circuited with an output terminal the over-threshold detector common mode generating unit, to generate an over-threshold detector common mode level;
an output terminal of the third switching constant current source module, an output terminal of the fourth switching constant current source module, an upper electrode plate of the second node capacitor and one terminal of the second reset switch are connected with the second over-threshold detector,
a lower electrode plate of the second node capacitor is grounded,
the other terminal of the reset switch is connected with the output terminal of the common mode output buffer.

6. The highly linear time amplifier with power supply rejection according to claim 5, wherein
a charging time of the first switching constant current source module is controlled according to the first control clock signal, and a charging time of the fourth switching constant current source module is controlled according to the fourth control clock signal,
after the charging is completed, the second switching constant current source module and the fourth switching constant current source module discharge to the first node capacitor and the second node capacitor, under a control of the third control clock signal, until the input levels of the first over-threshold detector and the second over-threshold detector reach threshold values respectively, then the outputs of the first over-threshold detector and the second over-threshold detector are reversed to complete the time amplification.

7. The highly linear time amplifier with power supply rejection according to claim 3, wherein output channels of the first output interface and the second output interface have a pseudo-differential structure.

8. The highly linear time amplifier with power supply rejection according to claim 3, wherein the circuit structure of the first over-threshold detector is same as the circuit structure of the second over-threshold detector,
the over-threshold detection units comprise one or more inverters, the first inverter at the input terminal of the first over-threshold detector and the second over-threshold detector has a structure the same as a structure of the over-threshold detector common mode generating unit.

9. The highly linear time amplifier with power supply rejection according to claim 6, wherein an amplification factor of the highly linear time amplifier is obtained by the following formula:

$$\begin{cases} t_{discp} = \dfrac{I_{CHAGP}}{I_{DISCP}} t_{chagp} - \dfrac{V_M}{I_{DISCP}} C_{SP} \\ t_{discn} = \dfrac{I_{CHAGN}}{I_{DISCN}} t_{chagn} - \dfrac{V_M}{I_{DISCN}} C_{SN} \end{cases},$$

$V_M$ is the reset level, $t_{chagp}$ and $t_{chagn}$ are the charging time determined by the first clock control signal and the second clock control signal respectively, $t_{discp}$ and $t_{discn}$ are the time that the input level of the first over-threshold detector and the second the over-threshold detector decreases to the corresponding threshold value respectively, $I_{CHAGP}$ is the first constant current source, $I_{CHAGN}$ is the second constant current source, $I_{DISCP}$ is the third constant current source, and $I_{DISCN}$ is the fourth constant current source.

10. The highly linear time amplifier with power supply rejection according to claim 6, wherein the plurality of switch constant current source modules outputs a constant current during operation.

* * * * *